United States Patent
Hira et al.

(10) Patent No.: US 9,978,929 B2
(45) Date of Patent: May 22, 2018

(54) ELECTRONIC COMPONENT AND METHOD FOR MANUFACTURING THE SAME

(71) Applicant: Murata Manufacturing Co., Ltd., Nagaokakyo-shi, Kyoto-fu (JP)

(72) Inventors: Mitsuyoshi Hira, Nagaokakyo (JP); Motoji Tsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 550 days.

(21) Appl. No.: 14/619,367

(22) Filed: Feb. 11, 2015

(65) Prior Publication Data
US 2015/0243875 A1 Aug. 27, 2015

(30) Foreign Application Priority Data
Feb. 27, 2014 (JP) .................................. 2014-036903

(51) Int. Cl.
*H01L 41/04* (2006.01)
*H01L 41/053* (2006.01)
*H03H 9/10* (2006.01)

(52) U.S. Cl.
CPC ....... *H01L 41/0533* (2013.01); *H03H 9/1085* (2013.01); *H01L 2224/11* (2013.01); *H01L 2224/16225* (2013.01); *H01L 2924/181* (2013.01); *Y10T 156/1092* (2015.01)

(58) Field of Classification Search
CPC ........................... H01L 41/053; H01L 41/0471
See application file for complete search history.

(56) References Cited

U.S. PATENT DOCUMENTS

| 7,142,435 | B2 * | 11/2006 | Goto ....................... H01L 23/04 257/E23.181 |
| 7,259,500 | B2 * | 8/2007 | Iwamoto ................ H03H 9/059 310/340 |
| 8,729,776 | B2 * | 5/2014 | Matsuda .............. H03H 9/1071 310/313 R |
| 9,520,859 | B2 * | 12/2016 | Inate .................. H03H 9/02913 |
| 9,748,919 | B2 * | 8/2017 | Hira ...................... H03H 9/1085 |
| 2007/0108634 | A1 * | 5/2007 | Higashi ................... H01L 23/04 257/787 |

(Continued)

FOREIGN PATENT DOCUMENTS

| JP | 2009-200996 A | 9/2009 |
| JP | 4811232 B2 | 11/2011 |
| WO | 2012/120968 A1 | 9/2012 |

OTHER PUBLICATIONS

Official Communication issued in corresponding Japanese Patent Application No. 2014-036903, dated Dec. 22, 2015.

*Primary Examiner* — J. San Martin

(74) *Attorney, Agent, or Firm* — Keating & Bennett, LLP

(57) ABSTRACT

An electronic component includes a package substrate, an electronic component element mounted on the package substrate and includes an element substrate, a support layer, and a cover member, and a mold resin layer provided on the package substrate so as to seal the electronic component element. The cover member includes a first cover member provided on the package substrate and a second cover member provided on the first cover member. The glass transition temperature of a resin material of the first cover member is higher than that of a resin material of the second cover member.

9 Claims, 3 Drawing Sheets

(56) References Cited

U.S. PATENT DOCUMENTS

| | | | |
|---|---|---|---|
| 2009/0309673 A1* | 12/2009 | Iwamoto | H03H 3/08 333/133 |
| 2011/0084573 A1* | 4/2011 | Yamaji | H03H 9/1092 310/340 |
| 2011/0221546 A1* | 9/2011 | Yamaji | H03H 9/1071 333/193 |
| 2012/0086309 A1* | 4/2012 | Yamaji | H03H 9/1092 310/313 B |
| 2012/0223789 A1* | 9/2012 | Inoue | H01L 41/053 333/193 |
| 2012/0280768 A1* | 11/2012 | Nakayama | H03H 9/0057 333/193 |
| 2013/0057361 A1* | 3/2013 | Sakano | H01L 23/3121 333/193 |
| 2013/0205586 A1* | 8/2013 | Takada | H03H 9/0523 29/829 |
| 2013/0335171 A1* | 12/2013 | Yamato | H03H 9/059 333/193 |

* cited by examiner

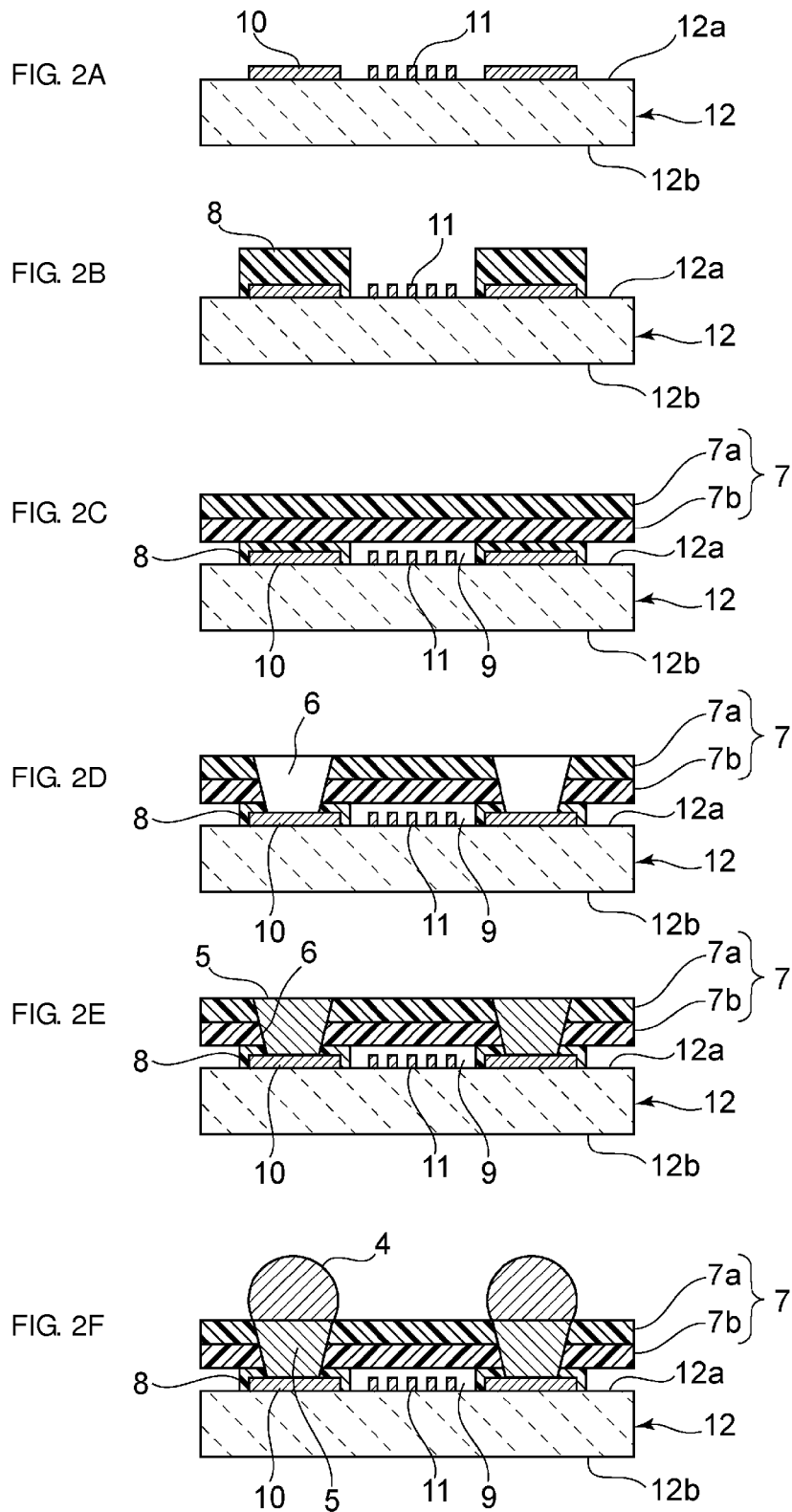

ELECTRONIC COMPONENT AND METHOD FOR MANUFACTURING THE SAME

BACKGROUND OF THE INVENTION

1. Field of the Invention

The present invention relates to an electronic component including a mold resin layer and a method for manufacturing the electronic component.

2. Description of the Related Art

An electronic component including a mold resin layer has been widely used.

In a surface acoustic wave device disclosed in Japanese Patent No. 4811232, a protective body having a lower elastic modulus than that of a mold resin is provided on a cover member. Accordingly, the durability against a pressure impact applied to the surface acoustic wave device during resin molding can be improved.

However, even in the surface acoustic wave device disclosed in Japanese Patent No. 4811232, the cover member was deformed in some cases by a pressure applied thereto during the resin molding. Since the deformed cover member was brought into contact with, for example, an IDT electrode, the IDT electrode was damaged in some cases.

SUMMARY OF THE INVENTION

Preferred embodiments of the present invention provide an electronic component which is highly resistant to damage even if a pressure is applied thereto during resin molding or the like and a method for manufacturing the electronic component.

An electronic component according to a preferred embodiment of the present invention includes an electronic component element which includes an element substrate including a first primary surface and a second primary surface facing each other, an electrode portion located on the first primary surface, a support layer provided on the first primary surface and including an opening portion facing inward toward the electrode portion, and a cover member bonded to the support layer so as to close the opening portion of the support layer, and in which at least a portion of the electrode portion is exposed to a hollow portion defined by the element substrate, the support layer, and the cover member; a package substrate facing the cover member with a predetermined gap provided therebetween and on which the electronic component element is mounted; and a mold resin layer provided on the package substrate so as to seal a periphery of the electronic component element. The cover member includes a first cover member provided at a package substrate side and including a resin material and a second cover member provided on the first cover member at an element substrate side and including a resin material. The glass transition temperature of the first cover member is higher than that of the second cover member.

In a specific aspect of the electronic component according to various preferred embodiments of the present invention, there are further provided a pad electrode provided on the first primary surface of the element substrate and covered with the support layer, a through-hole provided in the support layer and the cover member so as to reach the pad electrode, an under-bump metal layer provided in the through-hole, and a bump electrode provided on the under-bump metal layer and electrically connected to the package substrate.

In another specific aspect of the electronic component according to various preferred embodiments of the present invention, the glass transition temperature of the first cover member preferably is approximately 180° C. or more, for example, and the glass transition temperature of the second cover member preferably is approximately 150° C. or less, for example.

In another specific aspect of the electronic component according to various preferred embodiments of the present invention, the support layer is preferably made of a resin material, the glass transition temperature of the first cover member is higher than that of the support layer, the glass transition temperature of the support layer is higher than that of the second cover member, and the glass transition temperature of the second cover member is higher than that of the mold resin layer.

In another specific aspect of the electronic component according to various preferred embodiments of the present invention, the support layer is preferably made of a resin material, the glass transition temperature of the first cover member is higher than that of the support layer, the glass transition temperature of the support layer is higher than that of the second cover member, and the upper limit of an operation temperature is lower than the glass transition temperature of the mold resin layer.

In another specific aspect of the electronic component according to various preferred embodiments of the present invention, the elastic modulus of the mold resin layer is higher than that of the first cover member, and the elastic modulus of the first cover member is higher than that of the second cover member.

A method for manufacturing an electronic component according to another preferred embodiment of the present invention includes the steps of preparing an electronic component element which includes an element substrate including a first primary surface and a second primary surface facing each other and an electrode portion provided on the first primary surface; providing a support layer on the first primary surface so as to surround the electrode portion; providing a cover member which includes a first cover member and a second cover member provided thereon on the support layer so that the first primary surface faces the second cover member, the glass transition temperature of the first cover member being higher than that of the second cover member; thermally curing the cover member; providing a package substrate on the surface of the first cover member opposite to that on which the second cover member is provided; and providing a mold resin layer on the package substrate so as to seal the electronic component element.

In a specific aspect of the method for manufacturing an electronic component according to various preferred embodiments of the present invention, the method also includes the steps of providing a pad electrode on the first primary surface of the element substrate of the electronic component element; providing a through-hole in the support layer and the cover member so as to reach the pad electrode; providing an under-bump metal layer in the through-hole; and providing a bump electrode on the under-bump metal layer so as to be electrically connected to the package substrate, and the step of providing a support layer is performed so as to cover the pad electrode.

In another specific aspect of the method for manufacturing an electronic component according to various preferred embodiments of the present invention, the step of providing a cover member includes a step of bonding a laminate of the first cover member and the second cover member to the support layer.

In another specific aspect of the method for manufacturing an electronic component according to various preferred embodiments of the present invention, the support layer is formed from a resin material, the glass transition temperature of the first cover member is higher than a temperature of thermally curing the cover member, the temperature of thermally curing the cover member is higher than the glass transition temperature of the support layer, the glass transition temperature of the support layer is higher than that of the second cover member, and the glass transition temperature of the second cover member is higher than that of the mold resin layer.

In another specific aspect of the method for manufacturing an electronic component according to various preferred embodiments of the present invention, the support layer is formed from a resin material, the glass transition temperature of the first cover member is higher than a temperature of thermally curing the cover member, the temperature of thermally curing the cover member is higher than the glass transition temperature of the support layer, the glass transition temperature of the support layer is higher than that of the second cover member, and an operation temperature is lower than the glass transition temperature of the mold resin layer.

In another specific aspect of the method for manufacturing an electronic component according to various preferred embodiments of the present invention, the elastic modulus of the mold resin layer is higher than that of the first cover member, and the elastic modulus of the first cover member is higher than that of the second cover member.

According to various preferred embodiments of the present invention, an electronic component that is highly resistant to being damaged even if a pressure is applied thereto during resin molding or the like is provided, and in addition, a method for manufacturing the electronic component described above is also provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2F are schematic cross-section views each illustrating a method for manufacturing an electronic component element preferably used in a preferred embodiment of the present invention.

DETAILED DESCRIPTION OF THE PREFERRED EMBODIMENTS

Hereinafter, preferred embodiments of the present invention will be described with reference to the drawings.

Figure 1:
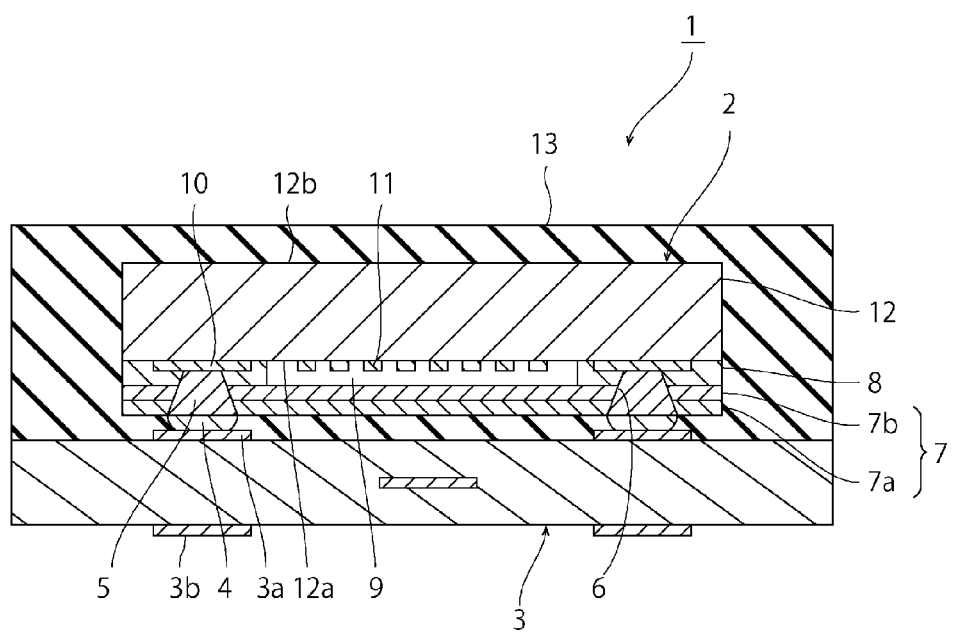
FIG. 1 is a schematic front cross-section view of an electronic component according to a preferred embodiment of the present invention.
Figure 3A:
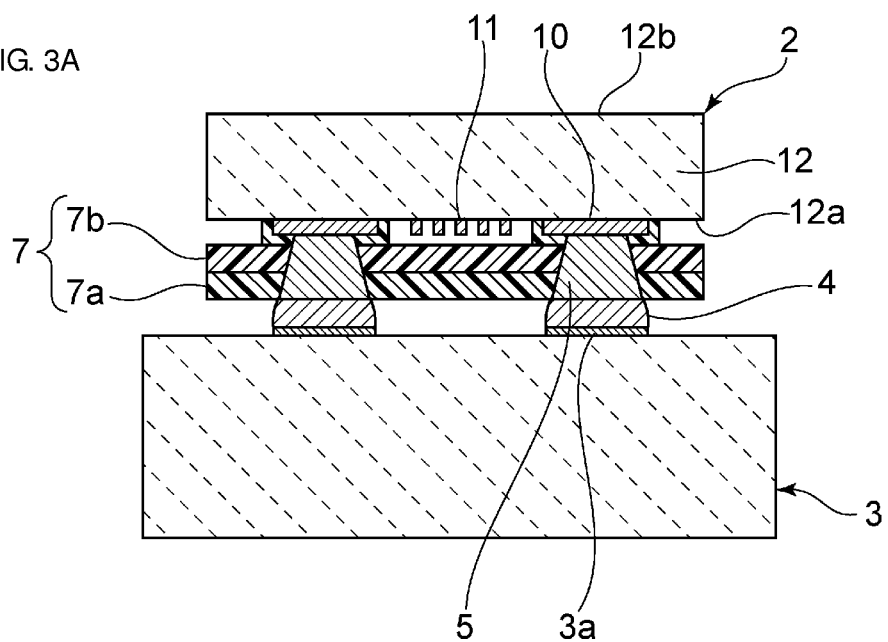
FIGS. 3A and 3B are schematic cross-section views each illustrating a manufacturing step of sealing the electronic component element used in a preferred embodiment of the present invention with a sealing resin after being mounted on a package substrate.
Figure 3B:
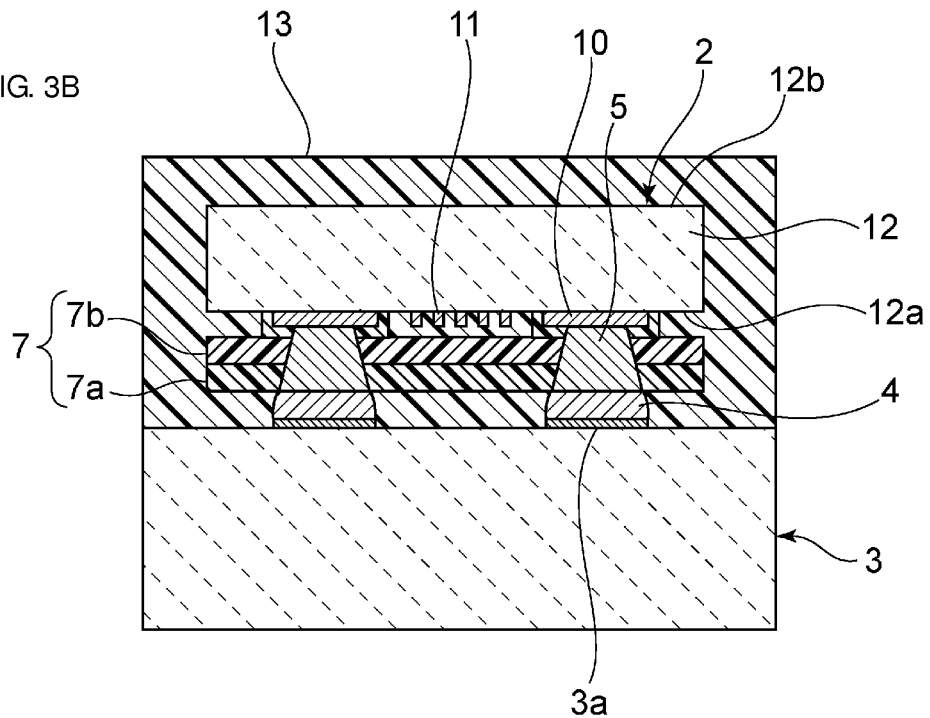

FIG. 1 is a schematic front cross-section view of an electronic component according to a preferred embodiment of the present invention. In addition, FIGS. 2A to 2F are schematic cross-section views each illustrating a non-limiting example of a method for manufacturing an electronic component element used in a preferred embodiment of the present invention and the structure thereof. FIGS. 3A and 3B are schematic cross-section views each illustrating a manufacturing step of sealing the electronic component element used in a preferred embodiment of the present invention with a sealing resin after being mounted on a package substrate. With reference to FIG. 1 and the other FIGS. 2A to 2F, 3A, and 3B, which show the manufacturing steps, the electronic component according to a preferred embodiment of the present invention will be described.

An electronic component 1 includes an electronic component element 2. The electronic component element 2 includes a piezoelectric substrate as an element substrate 12. The element substrate 12 preferably has a substantially plate shape. In addition, the element substrate 12 includes a first primary surface 12a and a second primary surface 12b facing each other. In this preferred embodiment, the element substrate 12 may be formed, for example, from a piezoelectric material, such as $LiNbO_3$, $LiTaO_3$, quartz, or zinc oxide. In addition, the element substrate 12 may be formed of a non-piezoelectric material carrier and a piezoelectric layer provided on the carrier. In addition, the element substrate 12 may also be formed from a dielectric material or an insulating material.

As shown in FIG. 2A, on the first primary surface 12a of the element substrate 12 defining and functioning as a piezoelectric substrate, an electrode portion 11 is provided. In this preferred embodiment, a portion of the electrode portion 11 defines and functions as an IDT electrode. With this IDT electrode, a surface acoustic wave element is provided. The electrode portion 11 is formed from an appropriate metal by a known manufacturing method, such as lift-off or etching. For example, the electrode portion 11 may be formed from Al, Pt, Au, Ag, Cu, Ni, Ti, Cr, Pd or an alloy primarily containing of one or more of those metals mentioned above.

As shown in FIG. 2A, on the first primary surface 12a of the element substrate 12, pad electrodes 10 are provided. The pad electrode 10 is electrically connected to the electrode portion 11. The pad electrode 10 may be formed from an appropriate metal.

As shown in FIG. 2B, on the first primary surface 12a of the element substrate 12, a support layer 8 is provided. The support layer 8 preferably has a substantially frame shape. The support layer 8 is provided to surround the IDT electrode, which is the portion of the electrode portion 11, and to cover the pad electrodes 10. The thickness of the support layer 8 is larger than that of the electrode portion 11 and that of the pad electrode 10. In addition, in this preferred embodiment, the support layer 8 is preferably made of a resin material in which a filler is added to a polyimide resin. Alternatively, the support layer 8 may also be made of another resin material. In addition, the support layer 8 may also be made of a ceramic.

As shown in FIG. 2C, on the support layer 8, a cover member 7 is provided. The cover member 7 is provided to face the element substrate 12 and to be spaced apart from the IDT electrode, which is the portion of the electrode portion 11, at a predetermined distance by the support layer 8. Accordingly, a hollow portion 9 surrounded by the cover member 7, the element substrate 12, and the support layer 8 is provided. The IDT electrode, which is the portion of the electrode portion 11, faces the hollow portion 9.

The cover member 7 is preferably formed by laminating a first cover member 7a and a second cover member 7b. The second cover member 7b faces the first primary surface 12a of the element substrate 12. The first cover member 7a is provided on the surface of the second cover member 7b opposite to that facing the element substrate 12.

The first cover member 7a and the second cover member 7b are each preferably made of a resin material having a glass transition point. The temperature at which a resin material reaches the glass transition point is regarded as the glass transition temperature. The glass transition temperature of the first cover member 7a is higher than that of the second cover member 7b. The first cover member 7a may made of, for example, a resin material in which a silicone rubber is added to a polyimide resin. In addition, the second cover member 7b may be made of, for example, a resin material in which a silicon rubber is added to an epoxy resin. Alternatively, as long as the glass transition temperature of the first cover member 7a is higher than that of the second cover member 7b, the first cover member 7a and the second cover member 7b may include a combination between appropriate resin materials.

In addition, in this preferred embodiment, although the first cover member 7a and the second cover member 7b preferably are directly laminated to each other, for example, another layer may also be provided therebetween.

As shown in FIG. 2D, through-holes 6 reaching the pad electrodes 10 are provided in the cover member 7 and the support layer 8. As shown in FIG. 2E, a conductive material is filled in the through-hole 6 by a known method, such as plating, to be in contact with the pad electrode 10, so that an under-bump metal layer 5 is provided. As shown in FIG. 2F, on the under-bump metal layer 5, a bump electrode 4 is provided. The under-bump metal layer 5 may be made of an appropriate metal. For example, at least one material selected from the group consisting of Al, Pt, Au, Ag, Cu, Ni, Ti, Cr, Pd, and an alloy primarily containing at least one of those metals mentioned above may be used as the appropriate metal. In addition, for example, the bump electrode 4 may be made of a metal, such as solder.

In addition, when the electronic component element shown in FIG. 1 is manufactured, a mother substrate may be used. For example, first, a plurality of electrode portions each including the IDT electrode and a plurality of support layers are formed on the mother substrate which is a substantially wafer-shaped piezoelectric substrate. Next, a substantially sheet-shaped cover member is bonded to the support layers. Furthermore, under-bump metal layers and the bump electrodes are formed. Subsequently, the mother substrate is divided into individual substrates each for the electronic component element.

As shown in FIGS. 3A and 3B, the bump electrode 4 is bonded to an electrode land 3a provided on a package substrate 3 and is also electrically connected thereto. The electronic component element 2 and the package substrate 3 are bonded to each other with the bump electrode 4 provided therebetween. Accordingly, the electronic component element 2 and the package substrate 3 are arranged with a predetermined distance therebetween. In addition, the package substrate 3 is provided with terminal electrodes 3b to be electrically connected to the outside. As shown in FIG. 3B, on the package substrate 3, a mold resin layer 13 is provided so as to seal the electronic component element 2 by covering the periphery thereof. The mold resin layer 13 may be formed from an appropriate resin. For example, an epoxy resin may be used.

In addition, without providing the through-holes 6 and the under-bump metal layers 5, the electronic component element 2 and the package substrate 3 may be electrically connected to each other with an appropriate wire.

As in the case disclosed in Japanese Patent No. 4811232, when the mold resin layer is formed by resin molding, the temperature and the pressure are applied to the electronic component. Hence, by a fluidized resin material which flows into a gap between the package substrate and the cover member, the cover member is deformed to an element substrate side. As a result, since the cover member is brought into contact with the electrode portion, such as the IDT electrode, interference with the IDT electrode and/or the damage to the electrode portion may occur in some cases.

In the electronic component 1 of this preferred embodiment, the glass transition temperature of the first cover member 7a preferably is higher than that of the second cover member 7b. Accordingly, even if the pressure is applied during the resin molding or the like, damage to the electrode portion 11 is prevented from occurring or significantly reduced so as to be negligible. The reason for this is as described below.

The first cover member 7a is deformed to an electrode portion 11 side by the temperature and the pressure during the resin molding. Since the deformed first cover member 7a presses the second cover member 7b, a pressure which deforms the second cover member 7b to the electrode portion 11 side is applied. However, in this preferred embodiment, when the temperature is increased, since the glass transition temperature of the first cover member 7a is relatively higher than that of the second cover member 7b, the first cover member 7a is difficult to deform as compared to the second cover member 7b. Hence, the pressure received by the second cover member 7b due to the deformation of the first cover member 7a is significantly decreased. As a result, since the second cover member 7b is very difficult to be brought into contact with the electrode portion 11, the damage to the electrode portion 11 is prevented from occurring or significantly reduced so as to be negligible.

The glass transition temperature of the first cover member 7a is preferably higher than that of the second cover member 7b by approximately 80° C. or more, for example. The reason for this is that the amount of deformation of the first cover member 7a is capable of being relatively further decreased as compared to that of the second cover member 7b. In addition, it is preferable that the glass transition temperature of the first cover member 7a be approximately 180° C. or more, and the glass transition temperature of the second cover member 7b be approximately 100° C. or less, for example. Accordingly, the pressure received by the second cover member 7b due to the deformation of the first cover member 7a is further decreased. Hence, the damage to the electrode portion 11 caused by the contact between the second cover member 7b and the electrode portion 11 is more difficult to occur.

In addition, since the glass transition temperature of the second cover member 7b is low, the second cover member 7b is likely to be deformed when the temperature is increased. Hence, the adhesion between the second cover member 7b and the support layer 8 is increased. Accordingly, during the resin molding, a gap between the second cover member 7b and the support layer 8 becomes difficult to generate. As a result, since the air-tightness of the hollow portion 9 is high, the mold resin is more difficult to flow into the hollow portion 9. Since the generation of the gap between the second cover member 7b and the support layer 8 is significantly reduced or prevented, the degradation in air-tightness of the hollow portion 9 is significantly reduced or prevented.

As for the relationship in glass transition temperature between the constituent elements, it is preferable that the glass transition temperature of the first cover member 7a be higher than that of the support layer 8, the glass transition temperature of the support layer 8 be higher than that of the second cover member 7*b*, and the glass transition temperature of the second cover member 7*b* be higher than that of the mold resin layer 13.

In the case described above, since the first cover member 7*a* is difficult to be deformed when the temperature is increased, the pressure which deforms the second cover member 7*b* is small. The support layer 8 is also difficult to be deformed by the pressure during the resin molding, and from this point of view, the support layer 8 is second to the first cover member 7*a*. In addition, since the support layer 8 and the second cover member 7*b* are likely to be deformed as compared to the first cover member 7*a*, the adhesion between the support layer 8 and the second cover member 7*b* is high. Hence, even if the pressure is applied during the resin molding or the like, the damage to the electrode portion 11 is significantly reduced or prevented. In addition, the mold resin is far less likely to flow into the hollow portion 9, if it does at all.

In addition, since the glass transition temperature of the mold resin layer 13 is lower than the glass transition temperatures of the first cover member 7*a*, the support layer 8, and the second cover member 7*b*, the fluidity of the mold resin layer 13 is increased at a relatively lowest temperature. Hence, the resin molding is performed while the first cover member 7*a*, the support layer 8, and the second cover member 7*b* are highly resistant to undergoing any deformation due to the pressure during the resin molding. As a result, the damage during the resin molding is further reduced or prevented.

In addition, as for the relationship in glass transition temperature between the individual constituent elements, it is preferable that the glass transition temperature of the first cover member 7*a* be higher than that of the support layer 8, the glass transition temperature of the support layer 8 be higher than that of the second cover member 7*b*, and the upper limit of an operation temperature of the electronic component 1 be lower than the glass transition temperature of the mold resin layer 13. Incidentally, the operation temperature indicates an allowable range of an environmental temperature while an electronic component is operated with a specified load applied thereto. In this preferred embodiment, for example, the range of the operation temperature preferably is approximately −25° C. to 85° C.

If the upper limit of the operation temperature of the electronic component 1 is higher than the glass transition temperature of the mold resin layer 13, the fluidity of the mold resin is increased when the electronic component 1 is operated. Since the mold resin flows, the under-bump metal layer 5 may be peeled away from the first cover member 7*a* or the package substrate 3 in some cases. On the other hand, when the upper limit of the operation temperature of the electronic component 1 is lower than the glass transition temperature of the mold resin layer 13, the damage, such as the peeling described above, during the operation is significantly reduced or prevented.

In addition, the glass transition temperature of the first cover member 7*a* is preferably approximately 180° C. or more, for example. The glass transition temperature of the support layer 8 is preferably approximately 120° C. to 200° C., for example. The glass transition temperature of the second cover member 7*b* is preferably approximately 100° C. or less, for example. The glass transition temperature of mold resin layer 13 is preferably approximately 50° C. to 150° C., for example.

As for the relationship in elastic modulus between the constituent elements, it is preferable that the elastic modulus of the mold resin layer 13 be higher than that of the first cover member 7*a*, and the elastic modulus of the first cover member 7*a* be higher than that of the second cover member 7*b*. In this case, when the first cover member 7*a* receives a pressure from the mold resin at the operation temperature, the first cover member 7*a* is likely to be deformed. Hence, since the first cover member 7*a* is deformed, the pressure is dispersed. In addition, since the elastic modulus of the first cover member 7*a* is higher than that of the second cover member 7*b*, the first cover member 7*a* defines and functions as a buffer to reduce the pressure applied to the second cover member 7*b*. Hence, not only during the resin molding but also during the operation, the damage to the electrode portion 11 is prevented from occurring or significantly reduced so as to be negligible.

Next, a non-limiting example of a method for manufacturing an electronic component of this preferred embodiment will be described.

The element substrate 12 is prepared which preferably has a substantially plate shape and which includes a first primary surface 12*a* and a second primary surface 12*b* facing each other. A metal film is formed on the first primary surface 12*a* of the element substrate 12 by sputtering, followed by performing patterning. Alternatively, a metal film having a predetermined pattern is formed using a mask, so that the electrode portion 11 is formed. Accordingly, the electronic component element 2 is formed.

A metal film is formed on the first primary surface 12*a* of the element substrate 12 by sputtering, followed by performing patterning. Alternatively, a metal film having a predetermined pattern is formed using a mask, so that the pad electrodes 10 are formed. In addition, the electrode portion 11 and the pad electrodes 10 may be simultaneously formed on the first primary surface 12*a* of the element substrate 12.

Next, on the first primary surface 12*a* of the element substrate 12, the support layer 8 is formed by a photolithographic technique and the like. The support layer 8 is formed so as to surround the electrode portion 11 and also to cover the pad electrodes 10. In addition, the support layer 8 is formed so as to be taller than the electrode portion 11.

Next, the cover member 7 is bonded to the support layer 8. The cover member 7 is formed of the first cover member 7*a* and the second cover member 7*b*. After the second cover member 7*b* is bonded to the support layer 8, the first cover member 7*a* may be laminated on the second cover member 7*b*. Alternatively, after the first cover member 7*a* and the second cover member 7*b* are integrated to each other by lamination, the laminate thus formed may be bonded to the support layer 8 from a second cover member 7*b* side. In addition, between the first cover member 7*a* and the second cover member 7*b*, another layer may be further provided.

Next, the cover member 7 is thermally cured. A temperature of thermally curing the cover member 7 is preferably lower than the glass transition temperature of the cover member 7 and higher than that of the support layer 8. In addition, the glass transition temperature of the support layer 8 is preferably higher than that of the second cover member 7*b*. Accordingly, the cover member 7 is more reliably thermally cured. In addition, the first cover member 7*a* may only be thermally cured.

Next, the through-holes 6 reaching the pad electrodes 10 are formed in the cover member 7 and the support layer 8 at positions corresponding to those of the pad electrodes 10 when viewed in plan. The through-hole 6 is formed by laser irradiation or the like. Next, in the through-hole 6, the under-bump metal layer 5 is formed so as to be in contact with the pad electrode 10. Subsequently, the bump electrode 4 is formed on the under-bump metal layer 5.

Next, the package substrate 3 provided with the electrode lands 3a and the terminal electrodes 3b is prepared. Subsequently, the electrode land 3a and the bump electrode 4 are bonded to each other. Accordingly, the package substrate 3 is provided on the surface of the first cover member 7a opposite to that on which the second cover member 7b is provided. Next, while heating is performed, the electronic component element 2 is resin-molded, so that the mold resin layer 13 is provided on the package substrate 3. The temperature during the resin molding is preferably equal to or higher than the glass transition temperature of a resin material forming the mold resin layer 13 or the melting point thereof. As a result, the electronic component 1 is completed.

In addition, the temperature of thermally curing the cover member is preferably approximately 180° C. to 270° C., for example. In addition, the glass transition temperature of the first cover member 7a is preferably approximately 180° C. or more, for example. The glass transition temperature of the support layer 8 is preferably approximately 120° C. to 200° C., for example. The glass transition temperature of the second cover member 7b is preferably approximately 100° C. or less, for example. The glass transition temperature of the mold resin layer 13 is preferably approximately 50° C. to 150° C., for example. In addition, the temperature of thermally curing the cover member 7 is not a thermal curing temperature in terms of a physical value but is a process temperature.

In addition, the temperature during the resin molding is preferably approximately 120° C. to 200° C. and more preferably approximately 150° C. to 180° C., for example.

The electronic component 1 may include, for example, a piezoelectric resonator in the hollow portion 9.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An electronic component comprises:
    an electronic component element including an element substrate including a first primary surface and a second primary surface facing each other, an electrode portion provided on the first primary surface, a support layer provided on the first primary surface and including an opening portion facing inward toward the electrode portion, and a cover member bonded to the support layer so as to close the opening portion of the support layer, and in which at least a portion of the electrode portion is exposed to a hollow portion defined by the element substrate, the support layer, and the cover member;
    a package substrate facing the cover member with a predetermined gap provided therebetween and on which the electronic component element is mounted; and
    a mold resin layer provided on the package substrate so as to seal a periphery of the electronic component element; wherein
    the cover member includes a first cover member provided at a package substrate side and containing a resin material and a second cover member provided on the first cover member at an element substrate side and containing a resin material;
    a glass transition temperature of the first cover member is higher than that of the second cover member;
    the support layer is made of a resin material;
    the glass transition temperature of the first cover member is higher than that of the support layer;
    the glass transition temperature of the support layer is higher than that of the second cover member; and
    the glass transition temperature of the second cover member is higher than that of the mold resin layer.

2. The electronic component according to claim 1, further comprising:
    a pad electrode provided on the first primary surface of the element substrate and covered with the support layer;
    a through-hole provided in the support layer and the cover member so as to reach the pad electrode;
    an under-bump metal layer provided in the through-hole; and
    a bump electrode provided on the under-bump metal layer and electrically connected to the package substrate.

3. The electronic component according to claim 1, wherein
    the glass transition temperature of the first cover member is about 180° C. or more; and
    the glass transition temperature of the second cover member is about 150° C. or less.

4. The electronic component according to claim 1, wherein
    an upper limit of an operation temperature is lower than the glass transition temperature of the mold resin layer.

5. The electronic component according to claim 1, wherein
    an elastic modulus of the mold resin layer is higher than that of the first cover member; and
    an elastic modulus of the first cover member is higher than that of the second cover member.

6. The electronic component according to claim 1, wherein the electronic component element is a surface acoustic wave element.

7. The electronic component according to claim 1, wherein the element substrate is a piezoelectric substrate.

8. The electronic component according to claim 7, further comprising an interdigital electrode on the piezoelectric substrate.

9. The electronic component according to claim 8, wherein the support element surrounds the interdigital electrode.

* * * * *